US012672584B2

(12) United States Patent
Lee et al.

(10) Patent No.: US 12,672,584 B2
(45) Date of Patent: Jun. 30, 2026

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Kyoung Yeon Lee, Incheon (KR); Jae Beom Shim, Incheon (KR); Byong Jin Kim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 232 days.

(21) Appl. No.: 17/945,414

(22) Filed: Sep. 15, 2022

(65) Prior Publication Data

US 2024/0096858 A1      Mar. 21, 2024

(51) Int. Cl.
*H01Q 1/22* (2006.01)
*H01Q 1/48* (2006.01)
(Continued)

(52) U.S. Cl.
CPC .............. *H10W 90/00* (2026.01); *H01Q 1/48* (2013.01); *H01Q 9/0407* (2013.01);
(Continued)

(58) Field of Classification Search
CPC ............. H01L 25/105; H01L 23/49816; H01L 23/5383; H01L 23/5385; H01L 25/50;
(Continued)

(56) References Cited

U.S. PATENT DOCUMENTS 6,639,299 B2 * 10/2003 Aoki ....................... H01L 24/14
                                                          257/532
8,766,858 B2 * 7/2014 Li ........................... H01Q 9/42
                                                          343/702

(Continued)

FOREIGN PATENT DOCUMENTS

CN        1273701 A   * 11/2000   ............. H01Q 1/243
CN     110768006 A   *  2/2020   ............. H01Q 5/307
CN     111063988 A   *  4/2020   ............... H01Q 1/22

OTHER PUBLICATIONS

Amkor Technology, System in Package, Technology Solutions, Feb. 2022, Amkor Technology Incorporated, Tempe, Arizona, USA.

*Primary Examiner* — Dimary S Lopez Cruz
*Assistant Examiner* — Bamidele A Immanuel
(74) *Attorney, Agent, or Firm* — Spectrum IP Law Group LLC

(57) ABSTRACT

In one example, an electronic device comprises a lower substrate comprising a lower dielectric structure and a lower conductive structure, an electronic component coupled with a bottom side of the lower substrate and coupled with the lower conductive structure, an upper substrate over a top side of the lower substrate and comprising an upper dielectric structure and an upper conductive structure, an internal interconnect between the upper substrate and the lower substrate and coupled with the upper conductive structure and the lower conductive structure, and a first antenna component between the upper substrate and the lower substrate and coupled with the upper conductive structure. Other examples and related methods are also disclosed herein.

23 Claims, 7 Drawing Sheets

(51) Int. Cl.

| | | |
|---|---|---|
| *H01Q 9/04* | (2006.01) |
| *H10W 70/60* | (2026.01) |
| *H10W 70/685* | (2026.01) |
| *H10W 90/00* | (2026.01) |

(52) U.S. Cl.
CPC ........ *H10W 70/611* (2026.01); *H10W 70/685* (2026.01); *H10W 90/401* (2026.01); *H10W 90/701* (2026.01); *H10W 90/724* (2026.01)

(58) Field of Classification Search
CPC ........... H01L 24/16; H01L 2224/16227; H01L 23/66; H01L 2223/6677; H01Q 1/48; H01Q 9/0407; H01Q 21/065; H01Q 1/2283; H01Q 9/0414
See application file for complete search history.

(56) References Cited

U.S. PATENT DOCUMENTS

| | | | | |
|---|---|---|---|---|
| 9,437,535 | B2 * | 9/2016 | Nakamura | ........ H01L 23/49838 |
| 10,074,604 | B1 * | 9/2018 | Hou | ........................ H10P 72/74 |
| 10,074,615 | B1 * | 9/2018 | Tseng | .................... H10W 42/20 |
| 10,134,685 | B1 * | 11/2018 | Chen | .................... H10W 42/20 |
| 10,157,834 | B1 * | 12/2018 | Tang | .................... H01Q 1/2283 |
| 10,157,850 | B1 * | 12/2018 | Wu | .................... H10W 70/614 |
| 10,157,862 | B1 * | 12/2018 | Chen | .................... H10P 72/74 |
| 10,157,870 | B1 * | 12/2018 | Wu | .................... H10W 72/012 |
| 10,157,871 | B1 * | 12/2018 | Yu | .................... H10W 72/012 |
| 10,319,688 | B2 * | 6/2019 | Wolter | .................... H01Q 1/526 |
| 10,431,892 | B2 | 10/2019 | Garcia et al. | |
| 10,566,299 | B2 | 2/2020 | Chiang et al. | |
| 10,573,608 | B2 * | 2/2020 | Dogiamis | ............. H01L 23/552 |
| 2003/0142018 | A1 * | 7/2003 | Lange | .................... H01Q 1/007 |
| | | | | 343/897 |
| 2007/0231962 | A1 * | 10/2007 | Fujii | .................... H01Q 1/2283 |
| | | | | 438/107 |
| 2009/0168367 | A1 * | 7/2009 | Fujii | .................... H01L 23/3677 |
| | | | | 361/720 |
| 2013/0009320 | A1 * | 1/2013 | Yoo | .................... H01L 23/66 |
| | | | | 257/774 |
| 2013/0168848 | A1 * | 7/2013 | Lin | .................... H10W 70/09 |
| | | | | 257/737 |
| 2014/0035097 | A1 * | 2/2014 | Lin | .................... H01L 23/66 |
| | | | | 257/E29.325 |
| 2014/0151860 | A1 * | 6/2014 | Nakamura | ........... H01Q 9/0407 |
| | | | | 257/664 |
| 2014/0327155 | A1 * | 11/2014 | Kang | .................... H01L 25/105 |
| | | | | 257/777 |
| 2015/0145108 | A1 * | 5/2015 | Yap | .................... H01L 23/66 |
| | | | | 257/664 |
| 2015/0207197 | A1 * | 7/2015 | Fujita | .................... H01P 3/08 |
| | | | | 333/246 |
| 2015/0262902 | A1 * | 9/2015 | Shen | .................... H01L 23/147 |
| | | | | 438/107 |

| | | | | |
|---|---|---|---|---|
| 2015/0280327 | A1 * | 10/2015 | Spella | .................. H01Q 19/108 |
| | | | | 29/601 |
| 2015/0325925 | A1 * | 11/2015 | Kamgaing | .......... H01L 21/4853 |
| | | | | 343/893 |
| 2016/0172761 | A1 * | 6/2016 | Garcia | .................. G06K 19/077 |
| | | | | 343/700 MS |
| 2016/0190053 | A1 * | 6/2016 | Machida | ........... H01L 23/49822 |
| | | | | 361/768 |
| 2016/0218072 | A1 * | 7/2016 | Liao | .................... H01L 23/66 |
| 2016/0329299 | A1 * | 11/2016 | Lin | .................... H01L 23/5385 |
| 2017/0125355 | A1 * | 5/2017 | Su | .................... H10W 46/00 |
| 2017/0345761 | A1 | 11/2017 | Yu et al. | |
| 2018/0061726 | A1 * | 3/2018 | Anderson | ............... H01L 23/04 |
| 2018/0082954 | A1 * | 3/2018 | Lin | .................... H10W 70/614 |
| 2018/0096942 | A1 * | 4/2018 | Chiu | .................... H10W 70/614 |
| 2018/0286776 | A1 * | 10/2018 | Tai | .................... H10W 74/117 |
| 2018/0337148 | A1 * | 11/2018 | Baek | .................... H10W 44/20 |
| 2018/0366439 | A1 * | 12/2018 | Lin | .................... H10P 72/74 |
| 2019/0020114 | A1 * | 1/2019 | Paulotto | .................. H01Q 9/40 |
| 2019/0067219 | A1 * | 2/2019 | Lasiter | .................. H10W 44/20 |
| 2019/0116670 | A1 * | 4/2019 | Anderson | ........... H01Q 1/2283 |
| 2019/0157762 | A1 * | 5/2019 | Shibata | ............... H01Q 9/0407 |
| 2019/0221937 | A1 * | 7/2019 | Onaka | .................... H01Q 5/385 |
| 2019/0288382 | A1 * | 9/2019 | Kamgaing | ............... H01Q 1/38 |
| 2019/0355680 | A1 * | 11/2019 | Chuang | ............... H01L 23/5389 |
| 2020/0006846 | A1 * | 1/2020 | Lasiter | .................. H01Q 21/08 |
| 2020/0035625 | A1 * | 1/2020 | Wang | .................... H10P 72/74 |
| 2020/0075503 | A1 * | 3/2020 | Chuang | ........... H01L 25/165 |
| 2020/0076052 | A1 * | 3/2020 | Fay | .................... H01Q 1/2283 |
| 2020/0091095 | A1 * | 3/2020 | Jung | .................... H01L 24/47 |
| 2020/0161766 | A1 * | 5/2020 | Liu | .................... H01Q 1/2283 |
| 2020/0212536 | A1 | 7/2020 | Gupta et al. | |
| 2020/0259239 | A1 * | 8/2020 | Moallem | ........... H01L 23/49838 |
| 2020/0313279 | A1 * | 10/2020 | Kim | .................... H01Q 21/08 |
| 2020/0335869 | A1 * | 10/2020 | Jia | .................... H01Q 9/0457 |
| 2021/0013585 | A1 * | 1/2021 | Ho | .................... H01L 23/552 |
| 2021/0050651 | A1 * | 2/2021 | Jung | .................... H01Q 25/00 |
| 2021/0234256 | A1 | 7/2021 | Landesberger et al. | |
| 2021/0273315 | A1 * | 9/2021 | Cheng | ................. H01L 23/5385 |
| 2021/0335734 | A1 * | 10/2021 | You | .................... H01L 24/20 |
| 2021/0376490 | A1 * | 12/2021 | Kim | .................... H01Q 1/521 |
| 2022/0068739 | A1 * | 3/2022 | Son | .................... H01L 23/4926 |
| 2022/0069453 | A1 * | 3/2022 | Yun | .................... H04B 3/52 |
| 2022/0085493 | A1 * | 3/2022 | Jia | .................... H01Q 21/065 |
| 2022/0131262 | A1 * | 4/2022 | Chiang | ............. H01Q 1/2283 |
| 2022/0166149 | A1 * | 5/2022 | So | .................... H01Q 5/307 |
| 2022/0255238 | A1 * | 8/2022 | Yu | .................... H01Q 21/0025 |
| 2022/0285844 | A1 * | 9/2022 | Gupta | .................. H01Q 9/0457 |
| 2022/0344230 | A1 * | 10/2022 | Chang | ............. H01L 23/552 |
| 2022/0352623 | A1 * | 11/2022 | Wang | .................. H01Q 9/0421 |
| 2022/0359975 | A1 * | 11/2022 | Lai | .................... H01Q 9/285 |
| 2022/0368003 | A1 * | 11/2022 | Chiang | ............... H01Q 9/0485 |
| 2023/0028526 | A1 * | 1/2023 | Kim | .................... H01Q 19/005 |
| 2023/0088170 | A1 | 3/2023 | Brun et al. | |
| 2023/0112892 | A1 * | 4/2023 | Choi | .................. H01Q 21/0006 |
| | | | | 343/702 |
| 2023/0197679 | A1 | 6/2023 | Ecton et al. | |
| 2024/0258689 | A1 * | 8/2024 | Tian | .................... H01Q 1/243 |

* cited by examiner

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
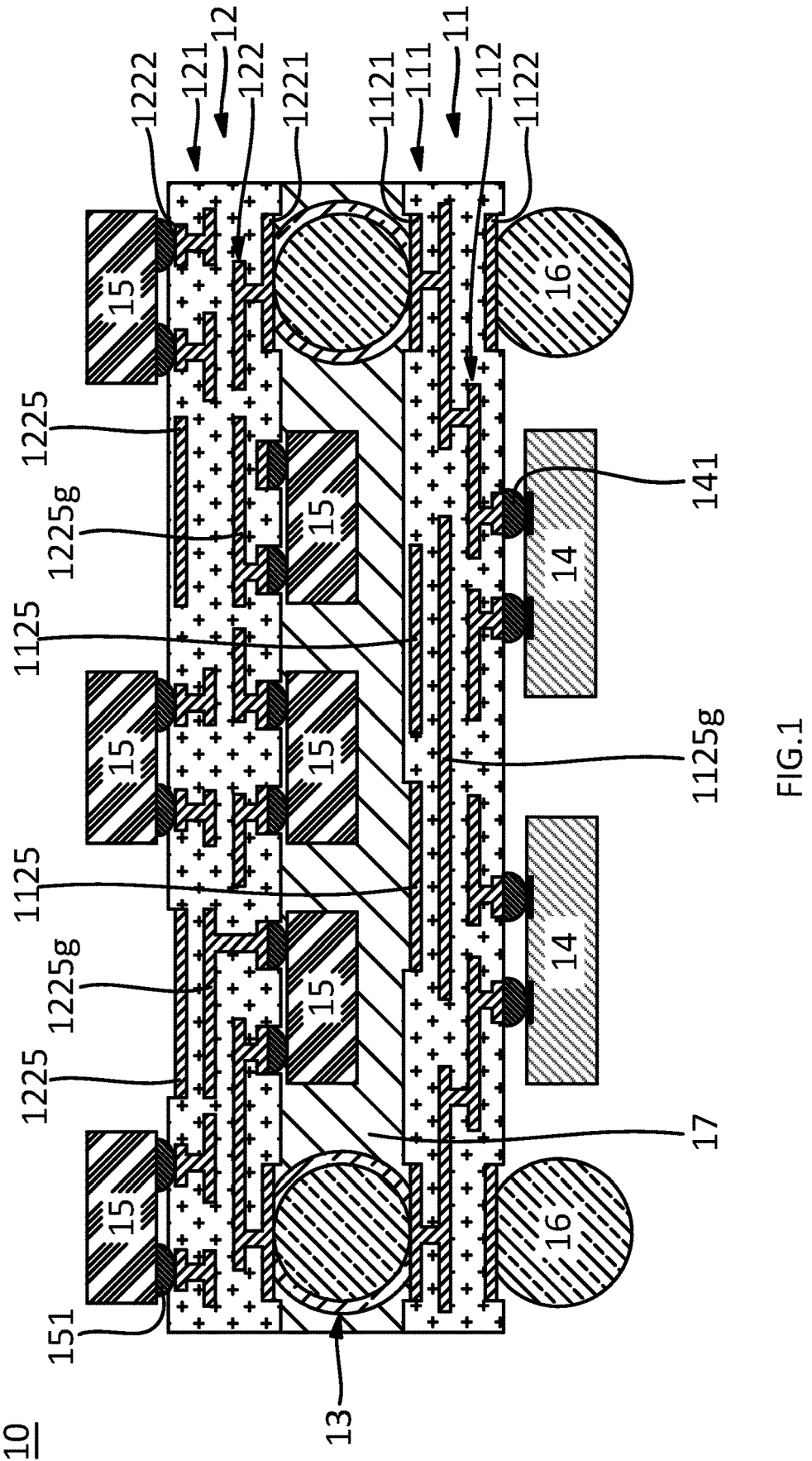
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$. The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises a lower substrate comprising a lower dielectric structure and a lower conductive structure, an electronic component coupled with a bottom side of the lower substrate and coupled with the lower conductive structure, an upper substrate over a top side of the lower substrate and comprising an upper dielectric structure and an upper conductive structure, an internal interconnect between the upper substrate and the lower substrate and coupled with the upper conductive structure and the lower conductive structure, and a first antenna component between the upper substrate and the lower substrate and coupled with the upper conductive structure.

In another example, an electronic device comprises a lower substrate comprising a lower dielectric structure and a lower conductive structure, an electronic component below a bottom side of the lower substrate and coupled with the lower conductive structure, and an upper substrate over a top side of the lower substrate and comprising an upper dielectric structure and an upper conductive structure. The upper conductive structure comprises an upper antenna pattern of a patch antenna, and an internal interconnect between the upper substrate and the lower substrate and coupled with the upper conductive structure and the lower conductive structure.

In a further example, a method to manufacture an electronic device comprises providing an upper substrate comprising an upper dielectric structure and an upper conductive structure, providing a first antenna component coupled with the upper conductive structure, providing an internal interconnect below a bottom side of the upper substrate and coupled with the upper conductive structure, providing a lower substrate comprising a lower dielectric structure and a lower conductive structure, wherein the internal interconnect is coupled with the lower conductive structure, providing an internal encapsulant between the upper substrate and the lower substrate and contacting the internal interconnect and a lateral side of the first antenna component, and providing an electronic component coupled with a bottom side of the lower substrate and coupled with the lower conductive structure.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise lower substrate 11, upper substrate 12, internal interconnects 13, electronic component 14, antenna components 15, external interconnects 16, and internal encapsulant 17.

Lower substrate 11 can comprise lower dielectric structure 111 and lower conductive structure 112. Lower conductive structure 112 can comprise lower inner terminals 1121, lower outer terminals 1122, and lower antenna patterns 1125 and 1125g. Upper substrate 12 can be over a top side of lower substrate 11 and can comprise upper dielectric structure 121 and upper conductive structure 122. Upper conductive structure 122 can comprise upper inner terminals 1221, upper outer terminals 1222, and upper antenna patterns 1225 and 1225g. Electronic component 14 can comprise component interconnects 141 and can be coupled with a bottom side of lower substrate 11 and coupled with lower conductive structure 112. Internal interconnects 13 can be between upper substrate 12 and lower substrate 11 and can be coupled with upper conductive structure 122 and lower conductive structure 112. Antenna components 15 can comprise component interconnects 151 can be between upper substrate 12 and lower substrate 11 or over a top side of upper substrate 12 and can be coupled with upper conductive structure 122. Internal encapsulant 17 can be between upper substrate 12 and lower substrate 11.

Lower substrate 11, upper substrate 12, internal interconnects 13, internal encapsulant 17, and external interconnects 16 can be referred to as an electronic package, such as a semiconductor package, an Antenna in Package (AiP), or an Antenna on Package (AoP), and the electronic package can provide protection for electronic component 14 or antenna components 15 from external elements or environmental exposure. The electronic package can provide coupling to external electrical components through external interconnects 16.

Figures 2A, 2B:
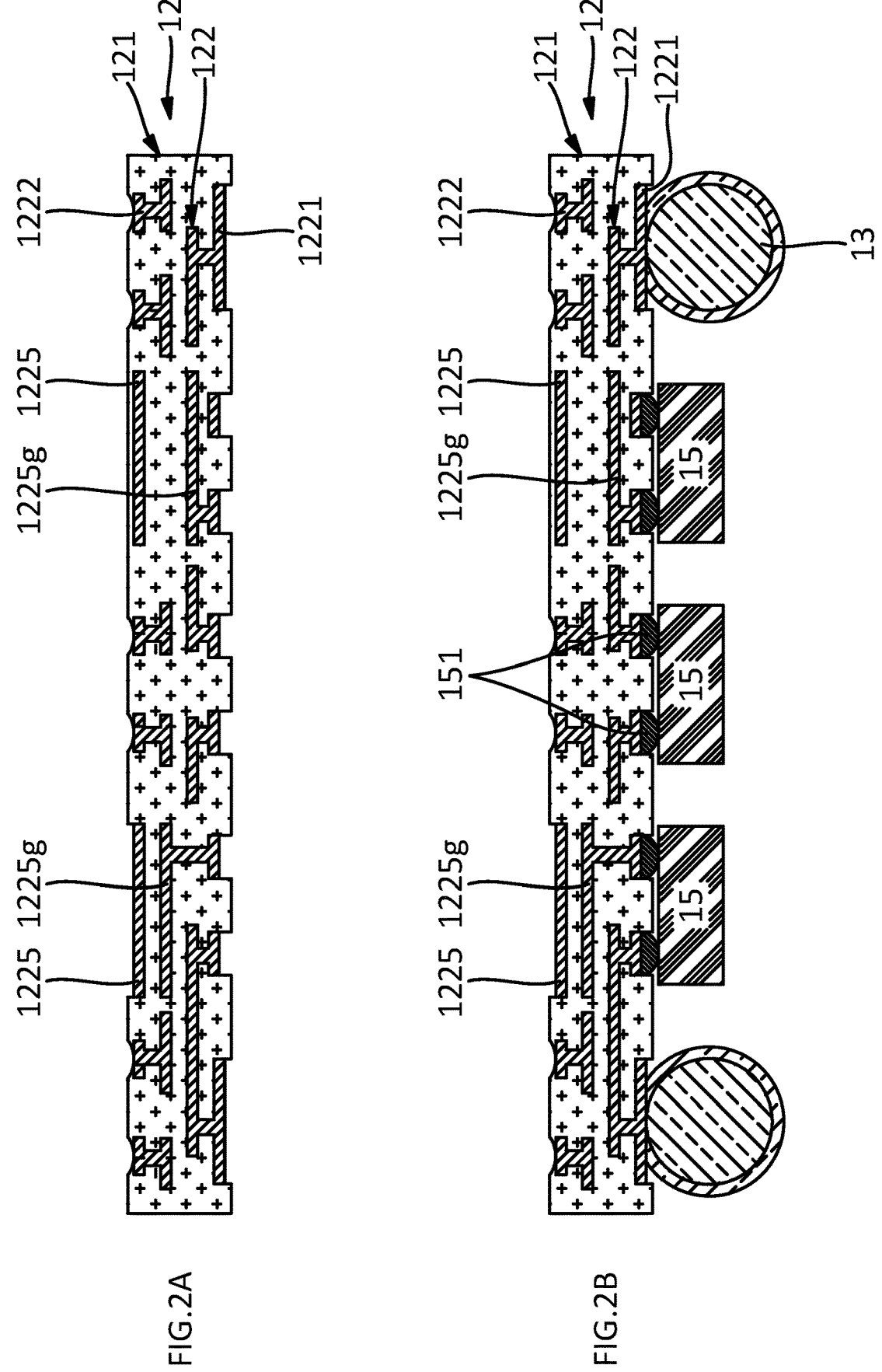
FIGS. 2A to 2F show cross-sectional views of an example method for manufacturing an example electronic device.

FIGS. 2A to 2F show cross-sectional views of an example method for manufacturing electronic device 10. FIG. 2A shows a cross-sectional view of electronic device 10 at an early stage of manufacture. In the example shown in FIG. 2A, upper substrate 12 can be provided. In some examples, upper substrate 12 can comprise or be referred to as a rigid printed circuit board, a flexible printed circuit board, or a package substrate. In some examples, the thickness of upper substrate 12 can range from approximately 40 micrometers (μm) to approximately 1000 μm. Upper substrate 12 can couple electronic components to each other and can protect the electronic components from external stress.

Upper substrate 12 can comprise upper dielectric structure 121 and upper conductive structure 122. Upper dielectric structure 121 can comprise or be referred to as one or more dielectric layers. In some examples, upper dielectric structure 121 can comprise copper foil/glass fiber fabric/copper foil laminate (FR4), ceramic, bismaleimide triazine (BT), polyimide (PI), benzocyclobutene (BCB), or polybenzoxazole (PBO). In some examples, the thickness of individual layers of upper dielectric structure 121 can range from approximately 3 μm to approximately 100 μm. The combined thickness of all layers of upper dielectric structure 121 can define the thickness of upper substrate 12. Upper dielectric structure 121 can maintain the outer shape of upper substrate 12 and can also structurally support upper conductive structure 122. Upper conductive structure 122 can comprise or be referred to as one or more conductive layers, paths, traces, vias, pads, patterns, or under bump metals (UBMs). In some examples, upper conductive structure 122 can comprise copper, aluminum, gold, silver, nickel, palladium, or an alloy. In some examples, the thickness of upper conductive structure 122 can range from approximately 3 μm to approximately 50 μm. The thickness of upper conductive structure 122 can refer to individual layers of upper conductive structure 122. Upper conductive structure 122 can provide an electrical signal path, for example a vertical path or a horizontal path, between electronic components.

Upper conductive structure 122 can comprise upper inner terminals 1221, upper outer terminals 1222, and upper antenna patterns 1225 and 1225*g*. Upper inner terminals 1221 can be provided on the bottom side of upper dielectric structure 121. Upper inner terminals 1221 can be exposed from the bottom side of upper dielectric structure 121. Upper inner terminals 1221 can be coupled to other elements of upper conductive structure 122. In some examples, upper inner terminals 1221 can comprise copper, aluminum, gold, silver, nickel, palladium, or an alloy. The thicknesses of upper inner terminals 1221 can range from approximately 3 μm to approximately 50 μm. Antenna components 15 or internal interconnects 13 can be coupled to upper inner terminals 1221 in a subsequent process.

Upper outer terminals 1222 can be provided on the top side of upper dielectric structure 121. Upper outer terminals 1222 can be exposed from the top side of upper dielectric structure 121. Upper outer terminals 1222 can be coupled to other elements of the upper conductive structure 122. In some examples, upper outer terminals 1222 can comprise copper, aluminum, gold, silver, nickel, palladium, or an alloy. The thicknesses of upper outer terminals 1222 can range from approximately 3 μm to approximately 50 μm. Antenna components 15 or other components or packages can be coupled to upper outer terminals 1222 in a subsequent process.

Upper antenna patterns 1225 can be provided on the top side of upper dielectric structure 121. In some examples, upper antenna patterns 1225 can be exposed from the top side of upper dielectric structure 121. There can be examples where one or more layers of upper dielectric structure 121 can cover the top of an upper antenna pattern 1225. In some examples, upper antenna patterns 1225 can be coupled to other elements of upper conductive structure 122. There can be examples where one or more upper antenna patterns 1225 can be decoupled from the some or the rest of the elements of upper conductive structure 122. In some examples, upper antenna patterns 1225 can comprise or be referred to as integrated antennas, antenna arrays, antenna traces, patch antennas, microstrip antennas, dipole antennas, or phase-array antennas. In some examples, upper antenna patterns 1225 can comprise copper, aluminum, gold, silver, nickel, palladium, or an alloy. In some examples, the thicknesses of upper antenna patterns 1225 can range from approximately 3 μm to approximately 50 μm. Upper antenna patterns 1225 can transmit or receive radio frequency (RF) signals. In some examples, upper antenna patterns 1225 can be controlled to have different phases for each antenna or can be interfered with to perform beamforming. In some examples, upper antenna patterns 1225 can be optional, such as when other antenna elements such as antenna components 15 or lower antenna patterns 1125 are provided and sufficient for the requirements of electronic device 10.

In some examples, the lengths of upper antenna patterns 1225 can be similar or equal to the lengths of respective transmission or reception frequencies or wavelengths or can be approximately ½ or approximately ¼ of the lengths of the transmission/reception frequencies or wavelengths. In some examples, the lengths of upper antenna patterns 1225 can be determined according to not only transmission/reception frequencies or wavelengths but also the characteristics of electronic device 10, the material properties of upper substrate 12 such as dielectric and conductor characteristics, the thickness of upper substrate 12, the material properties of internal encapsulant 17 or the thickness of internal encapsulant 17. In some examples, the thickness of internal encapsulant 17 can be greater than the thickness of antenna components 15.

In some examples, upper conductive structure 122 can comprise one or more antenna ground patterns 1225*g*, such as a ground plane, corresponding to upper antenna patterns 1225 and located inside or at the bottom side of upper dielectric structure 121. In some examples, since antenna performance is also related to the permittivity and thickness of a dielectric structure interposed between an antenna pattern and a ground pattern, the material and thickness of upper dielectric structure 121 can be determined in consideration of the antenna performance. In some examples, in order to enhance antenna performance, the dielectric constant of upper dielectric structure 121 can be designed to be as low as possible, or the thickness of upper dielectric structure 121 can be designed to be as thick as possible. In some examples, upper antenna patterns 1225 can support millimeter wave (mmWave) for Fifth Generation (5G) and sub-6 gigahertz (GHz) spectrum bands. In some examples, the material of upper dielectric structure 121 for 5G or sub-6 GHz can comprise a liquid crystal polymer (LCP), a modified polyimide (MPI), a fluorine-based resin, an epoxy-based resin, a polyphenylene ether (PPE)-based resin, or a polyphenylene sulfide (PPS)-based resin. In some examples, the dielectric constant of upper dielectric structure 121 for 5G or sub-6 GHz can range from approximately 2 to approximately 4. In some examples, the thickness of upper dielectric structure 121 for 5G or sub-6 GHz can range from approximately 20 μm to approximately 100 μm Upper substrate 12 can be manufactured in various manners. By way of example of a two-layer FR4 substrate, upper substrate 12 can be manufactured by the operations of: processing a drill hole to couple a lower copper foil and an upper copper foil; coupling the lower copper foil and the upper copper foil by performing electroplating on the drill hole; providing a photosensitive film on the side of the substrate and photo-etching the photosensitive film so the sides of the lower copper foil and the upper copper foil are patterned, thereby patterning an outer layer circuit including upper inner terminals 1221, upper outer terminals 1222, and upper antenna patterns 1225 on the bottom side and top side of the substrate; providing a seed layer for plating, and is thinner than the outer circuit by performing electroless plating on the entire bottom side and top side of the substrate to cover the outer circuit; providing a photosensitive film on the seed layer for plating so as to cover the seed layer for plating, and performing photo-etching on the photosensitive film to pattern the seed layer for plating; providing a solder resist layer on the entire bottom side and top side of the substrate so the outer circuit is exposed; and forming a plating layer on the outer circuit including upper inner terminals 1221, upper outer terminals 1222, and upper antenna patterns 1225 exposed out of the solder resist layer by applying electricity to the plating seed layer.

In some examples, in the case of a three to six-layer substrate having more than two layers, an inner-layer circuit providing operation and a laminating operation can be performed on upper substrate 12. As an example, the inner-layer circuit providing operation can be performed by patterning an inner layer circuit on the bottom side and top side of each substrate by photo-etching a photosensitive film, so the sides of a lower copper foil and an upper copper foil are patterned for each substrate. As an example, the lamination operation can be performed by aligning each of the provided substrates and allowing each of the substrates to be integrated into one substrate while providing a predetermined temperature and pressure. In some examples, the dielectric structure can be a B-stage prepreg, and since the dielectric structure is in a C-stage state after the lamination operation, each substrate can be integrated to provide one multilayer substrate. In some examples, after the lamination process, a hole processing operation, a plating operation, or an outer layer circuit providing operation can be sequentially provided in similar manner as described above.

In some examples, upper substrate 12 can have a smaller number of layers than the number of layers of lower substrate 11, and accordingly, the manufacturing complexity or cost can be relatively lower, and low-level technology can be used.

In some examples, upper substrate 12 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In other examples, substrate 12 can be a redistribution layer ("RDL") substrate. RDL substrates can comprise one or more conductive redistribution layers and one or more dielectric layers that (a) can be formed layer by layer over an electronic device to which the RDL substrate is to be coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of one or more inorganic dielectric layers can comprise silicon nitride (Si3N4), silicon oxide (SiO2), and/or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bis-maleimide triazine (BT) or FR4 and these types of RDL substrates can be referred to as a coreless substrate.

FIG. 2B shows a cross-sectional view of electronic device 10 at a later stage of manufacture. In the example shown in FIG. 2B, antenna components 15 or internal interconnects 13 can be provided. The antenna components 15 can be coupled to upper substrate 12.

In some examples, antenna components 15 can be coupled to upper inner terminals 1221 of upper substrate 12 through component interconnects 151. In some examples, component interconnects 151 can comprise or be referred to as pads, bumps, or pillars. In some examples, component interconnects 151 can be coupled to upper inner terminals 1221 through solder or can be coupled in a solderless metal-to-metal direct coupling. In some examples, antenna components 15 each can comprise or be referred to as an antenna on package (AoP), an antenna in package (AiP), a 5G New Radio (NR) mmWave module, a sub-6 GHz RF module, a die, a chip, a package, a substrate, a passive component, an active component, a discrete antenna, an antenna array, an antenna trace, a patch antenna, a microstrip antenna, a dipole antenna, or a phase-array antenna. In some examples, antenna components 15 each can comprise a dielectric substrate, an antenna pattern at one side of the dielectric substrate, and a ground pattern plated at the other side of the dielectric substrate. In some examples, some component interconnects 151 can be provided for supplying power to antenna patterns, and some component interconnects 151 can be provided for grounding ground patterns. In some examples, the thicknesses of antenna components 15 can range from approximately 40 μm to approximately 1000 μm. Antenna components 15 can transmit or receive radio frequency signals, and in some examples can perform a phase-array operation.

In some examples, internal interconnects 13 can be coupled to upper inner terminals 1221 of upper substrate 12. In some examples, internal interconnects 13 can comprise or be referred to as solder balls, solder-coated metal core balls (e.g., copper core ball), pillars, or bumps. In some examples, internal interconnects 13 can be thicker than antenna components 15. In some examples, the thicknesses of internal interconnects 13 can range from approximately 60 μm to approximately 1020 μm. Internal interconnects 13 can allow lower substrate 11 and upper substrate 12 to be coupled together.

Figures 2C, 2D:
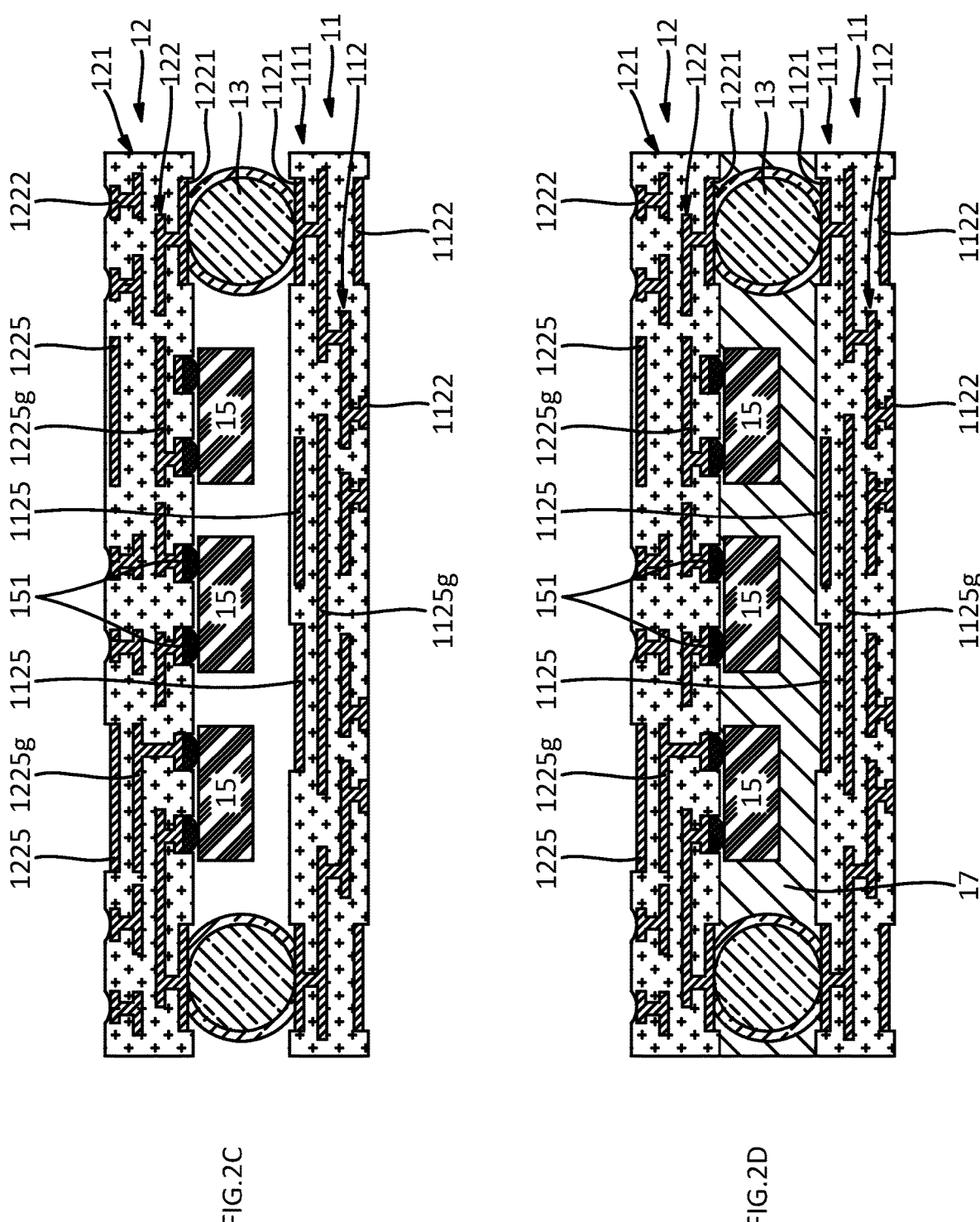

FIG. 2C shows a cross-sectional view of electronic device 10 at a later stage of manufacture. In the example shown in FIG. 2C, lower substrate 11 can be provided. Lower substrate 11 can comprise or be referred to as a rigid printed circuit board, a flexible printed circuit board, or a package substrate. In some examples, the thickness of lower substrate 11 can be thicker than the thickness of upper substrate 12 and can range from approximately 50 μm to approximately 1000 μm. Lower substrate 11 can couple electronic components to each other and can protect electronic components from external stress.

Lower substrate 11 can comprise lower dielectric structure 111 and lower conductive structure 112. Lower dielectric structure 111 can comprise or be referred to as one or more dielectric layers. In some examples, lower dielectric structure 111 can comprise FR4, ceramic, BT, PI, BCB, or PBO. In some examples, the thickness of individual layers of lower dielectric structure 111 can range from approximately 3 μm to approximately 50 μm. Lower dielectric structure 111 can maintain the outer shape of lower substrate 11 and can also structurally support lower conductive structure 112. Lower conductive structure 112 can comprise or be referred to as one or more conductive layers, paths, traces, vias, pads, patterns, or under bumped metals (UBMs). In some examples, lower conductive structure 112 can comprise copper, aluminum, gold, silver, nickel, palladium, or an alloy. In some examples, the thickness of lower conductive structure 112 can range from approximately 3 μm to approximately 50 μm. Lower dielectric structure 111 can provide an electrical signal path, such as a vertical path or a horizontal path, between electronic components.

Lower conductive structure 112 can comprise lower inner terminals 1121, lower outer terminals 1122, and lower antenna patterns 1125. Lower inner terminals 1121 can be provided on the upper side of lower dielectric structure 111. Lower inner terminals 1121 can be coupled to other elements of lower conductive structure 112. In some examples, lower inner terminals 1121 can comprise copper, aluminum, gold, silver, nickel, palladium, or an alloy. The thicknesses of lower inner terminals 1121 can range from approximately 3 μm to approximately 50 μm. Internal interconnects 13 can be coupled to lower inner terminals 1121.

Lower outer terminals 1122 can be provided on the bottom side of lower dielectric structure 111. Lower outer terminals 1122 can be coupled to other elements of lower conductive structure 112. In some examples, lower outer terminals 1122 can comprise copper, aluminum, gold, silver, nickel, palladium, or an alloy. The thicknesses of lower outer terminals 1122 can range from approximately 3 μm to approximately 50 μm. Electronic component 14 or external interconnects 16 can be coupled to lower outer terminals 1122 in a subsequent process.

Lower antenna patterns 1125 can be provided on the top side of lower dielectric structure 111. In some examples, lower antenna patterns 1125 can be exposed from the top side of lower dielectric structure 111. There can be examples where one or more layers of lower dielectric structure 111 can cover the top of lower antenna pattern 1125. In some examples, lower antenna patterns 1125 can be coupled to other elements of lower conductive structure 112. There can be examples where one or more lower antenna patterns 1125 can be decoupled from some or the rest of the elements of lower conductive structure 112. In some examples, lower antenna patterns 1125 can comprise or be referred to as integrated antennas, antenna arrays, antenna traces, patch antennas, dipole antennas, or phase-array antennas. In some examples, lower antenna patterns 1125 can comprise copper, aluminum, gold, silver, nickel, palladium, or an alloy. In some examples, the thicknesses of lower antenna patterns 1125 can range from approximately 3 μm to approximately 50 μm. Lower antenna patterns 1125 can transmit or receive radio frequency (RF) signals, and in some examples can perform a phase-array operation.

In some examples, the lengths of lower antenna patterns 1125 can be similar or equal to the lengths of respective transmission or reception frequencies or wavelengths or can be approximately ½ or approximately ¼ of the lengths of the transmission/reception frequencies or wavelengths. In some examples, lower conductive structure 112 can comprise one or more lower antenna ground patterns 1125g, such as a ground plane, corresponding to lower antenna patterns 1125 and located inside or at the bottom side of lower dielectric structure 111.

Features or elements of lower antenna patterns 1125 or lower antenna ground pattern 1125g can be similar to those of upper antenna patterns 1125 or antenna ground pattern 1225g described for upper substrate 12. In some examples, lower antenna patterns 1125 can be optional, such as when other antenna elements like antenna components 15 or upper antenna patterns 1225 are provided and sufficient for the requirements of electronic device 10.

In some implementations, the complexity of lower substrate 11 can be greater than that of upper substrate 12, for example to support interconnection or performance requirements of electronic component 14. For instance, electronic component 14 can comprise a large number of fine pitch component interconnects 141 coupled to lower substrate 11 such that lower substrate 11 can require greater pattern integration degree to support the interconnection or signaling requirements of electronic component 14. As an example, the number of dielectric or conductive layers, the thickness, or the pattern integration degree, for example conductive pattern density, or conductive pattern pitch, of lower substrate 11 can be greater than those of upper substrate 12. As an example, the number of dielectric or conductive layers of lower substrate 11 can be greater than those of upper substrate 12. As an example, the thickness of one or more dielectric or conductive layers of lower substrate 11 can be thicker or different than that of the dielectric or conductive layers of upper substrate 12. As an example, the line/space/pitch of the conductive structure of lower substrate 11 can be smaller or finer than the line/space/pitch of the conductive structure of upper substrate 12. As an example, lower substrate 11 can require higher manufacturing technology or cost than upper substrate 12.

Considering the above, upper substrate 12 can be a low complexity substrate for supporting upper antenna patterns 1225 or antenna components 15, and lower substrate 11 can be a medium complexity substrate for supporting interconnection requirements of electronic component 14. As an example, the number of conductive layers of lower substrate 11 can be greater than those of upper substrate 12. For instance, upper conductive structure 122 of upper substrate 12 can comprise up to three upper conductive layers, such as one or two conductive layers, while lower conductive structure 112 of lower substrate 11 can comprise up to six lower conductive layers, such as three or four conductive layers. Such arrangement can prevent lower substrate 11 from having to include additional complexity or layers to support upper antenna patterns 1225 or antenna components 15, reducing overall costs by reducing the complexity or cost or defectivity waste needed for lower substrate 11. Otherwise, lower substrate 11 could require a high complexity substrate with increased cost and defectivity, such as in the form more than six conductive layers needed for lower conductive structure 112.

FIG. 2D shows a cross-sectional view of electronic device 10 at a later stage of manufacture. In the example shown in FIG. 2D, internal encapsulant 17 can be provided between upper substrate 12 and lower substrate 11. In some examples, internal encapsulant 17 can contact the bottom side of upper substrate 12 and the upper side of lower substrate 11, respectively. In some examples, internal encapsulant 17 can contact upper antenna patterns 1225. In some examples, internal encapsulant 17 can contact antenna components 15 or internal interconnects 13. In some examples, antenna components 15 are covered with internal encapsulant 17, and antenna components 15 can be referred to as embedded antenna components.

In some examples, internal encapsulant 17 can comprise or be referred to as an epoxy molding compound, an epoxy molding resin, or a sealant. In some examples, internal encapsulant 17 can comprise or be referred to as a molding part, a sealing part, an encapsulation part, a protection part, or a package body. In some examples, internal encapsulant 17 can comprise an organic resin, an inorganic filler, a curing agent, a catalyst, a coupling agent, a colorant, or a flame retardant. In some examples, encapsulant 17 can be provided in a variety of ways, such as compression molding, transfer molding, liquid encapsulant molding, vacuum lamination, or paste printing. In some examples, the thickness of internal encapsulant 17 can range from approximately 60 μm to approximately 1020 μm. Internal encapsulant 17 can protect antenna components 15, lower antenna patterns 1125 or internal interconnects 13 from external elements or environmental exposure. In some examples, internal encapsulant 17 can be optional.

In some examples, upper antenna patterns 1225 can be provided with upper substrate 12, and antenna ground pattern 1225g need not be provided. In some examples, lower antenna ground pattern 1125g can be provided with lower substrate 11, and lower antenna patterns 1125 need not be provided. In some examples, upper antenna patterns 1225 can be provided with upper substrate 12, and lower antenna ground pattern 1125g corresponding to upper antenna patterns 1225 can be provided with lower substrate 11. In some examples, lower antenna patterns 1125 can be provided with lower substrate 11, and antenna ground pattern 1225g corresponding to upper antenna patterns 1125 can be provided with upper substrate 12.

Dielectrics can be interposed between the different antenna elements of electronic device 10. As an example, one or more layers of dielectric structure 121 of upper substrate 12 can be interposed between upper antenna patterns 1225 and antenna ground pattern 1225g. As an example, one or more layers of dielectric structure 111 of lower substrate 11 can be interposed between lower antenna patterns 1125 and lower antenna ground pattern 1125g. As an example, one or more layers of dielectric structure 111, dielectric structure 121, or internal encapsulant 17 can be interposed between upper antenna patterns 1225 and lower antenna ground pattern 1125g, or between lower antenna patterns 1125 and antenna ground pattern 1225g.

In order to tune antenna performance, the thicknesses of one or more layers of upper dielectric structure 121, of lower dielectric structure 111, or of internal encapsulant 17 can be adjusted to provide desired spacing between the respective antenna elements. In some examples, according to the thickness desired for internal encapsulant 17, the thicknesses of internal interconnects 13 can also be adjusted. In some examples, internal encapsulant 17 is omitted, wherein the permittivity of air can be used to tune antenna performance, and air can serve as dielectric interposed between antenna elements of upper substrate 12 and lower substrate 11. In such examples, the distances between antenna elements can be selected by controlling the thickness of the various structures of electronic device 10 such as the layers of upper dielectric structure 121, the layers of lower dielectric structure, or internal encapsulant, individually or in combination. The distances can be increased by increasing the thickness of one or more of these structures, or the distances can be decreased by decreasing the thickness of one or of the structures, to provide a selected tuning or wavelength of operation of one or more antenna structures described herein, alone or in combination with other tuning factors such as antenna length, type of antenna, and so on. It should be noted that providing selected thickness of these various structures or material selection thereof to tune antenna performance is discussed herein for purposes of example, and the scope of the disclosed subject matter is not limited in these respects.

Figure 2E:
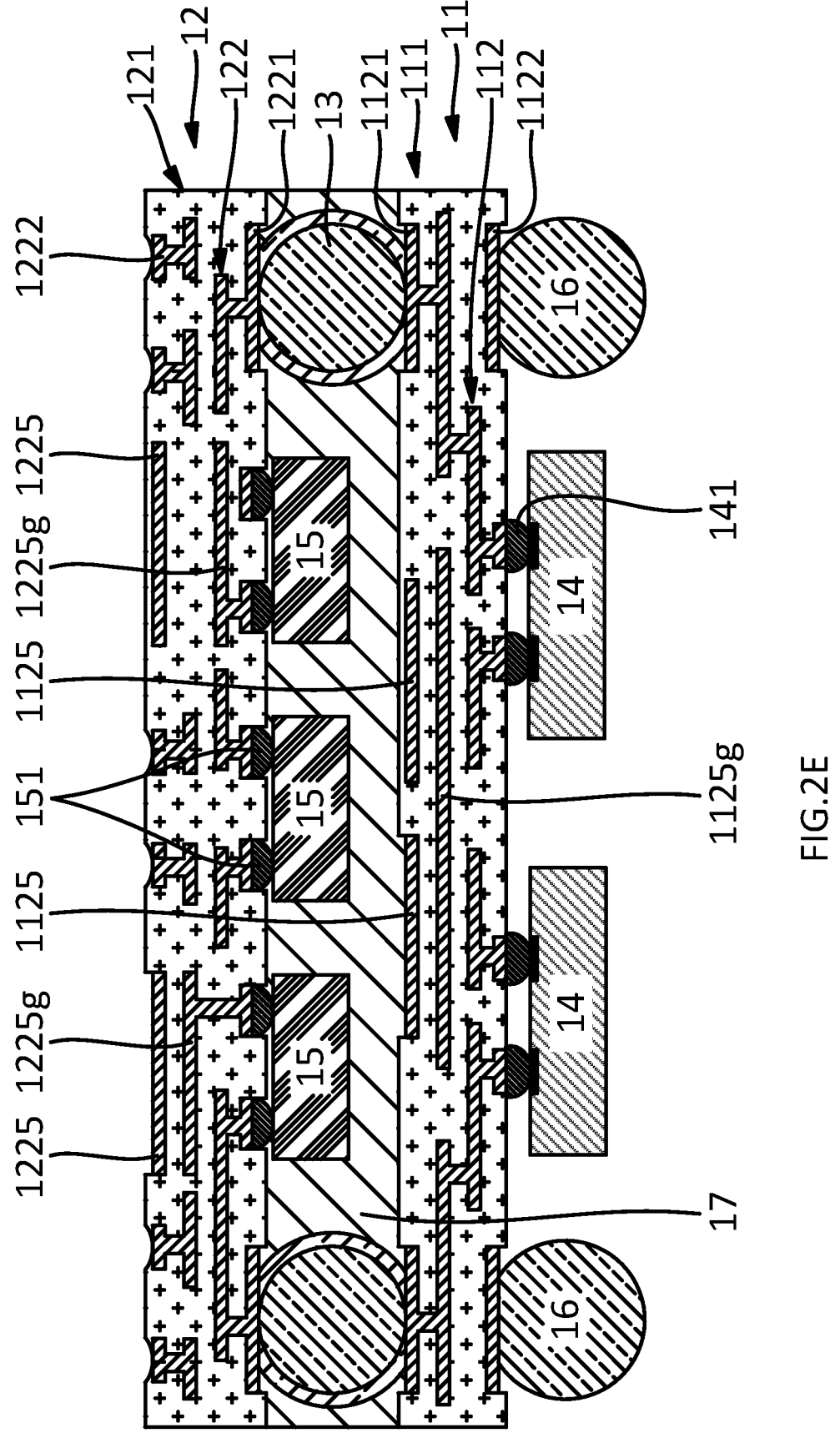

FIG. 2E shows a cross-sectional view of electronic device 10 at a later stage of manufacture. In the example shown in FIG. 2E, electronic component 14 or external interconnects 16 can be provided. Electronic component 14 can be coupled to lower outer terminals 1122 of lower substrate 11 through component interconnects 141. Component interconnects 141 can comprise pads, bumps, or pillars. In some examples, component interconnects 141 can be coupled to lower outer terminals 1122 through solder or can be coupled to lower outer terminals 1122 in a metal-to-metal direct coupling. Electronic component 14 can comprise or be referred to as a die, a chip, a package, a functional/active component, a passive component, a controller, a processor, a logic, or a memory. In some examples, the thickness of electronic component 14 can range from approximately 50 μm to approximately 800 μm. There can be more than one electronic components 14 of same or different types or functions coupled to the bottom of lower substrate 11.

In some examples, electronic component 14 can comprise or be referred to as a microwave integrated circuit (IC), a millimeter wave (mmWave) IC, a beamforming IC, or a front-end IC. In some examples, the microwave IC or the millimeter wave (mmWave) IC can support multi-antenna and multi-channel to support wireless or RF communications, such as 5G communication or 6G communication. In some examples, the microwave IC or the millimeter wave (mmWave) IC can include a logic circuit region for frequency band change, or an analog circuit region for frequency reception and amplification. In some examples, the beamforming IC can precisely set a relative gain and phase of each channel so that radio signals are consistently added in a desired direction of an antenna main beam using analog beamforming or digital beamforming. In some examples, the front-end IC can comprise a transmission-signal-power amplifier, a reception-signal-low-noise amplifier, and a switch for switching a transmitter and a receiver. In some examples, electronic component 14 can have various configurations and can perform various operations for operating electronic device 10.

External interconnects 16 can be coupled to lower outer terminals 1122 of lower substrate 11 to couple with lower conductive structure 112. External interconnects 16 can comprise or be referred to as solder balls, solder-coated, metal core balls such as copper core balls, pillars, or bumps. External interconnects 16 can be thicker than electronic component 14. In some examples, the thicknesses of external interconnects 16 can range from approximately 50 μm to approximately 1000 μm. External interconnects 16 can couple electronic device 10 to an external device.

Electronic device 10 can include various combinations of antenna structures in various arrangements. It should be noted that not all structures and arrangements are necessarily present or utilized in electronic device 10, and the antenna structures and arrangement of the antenna structures are shown and described herein for purposes of example. Some non-limiting examples are as follows. A first antenna structure can comprise lower antenna pattern 1125g and antenna component 15 on the top side of upper substrate 12. A second antenna structure can comprise lower antenna pattern 1125g and antenna component 15 on the bottom side of upper substrate 12. A third antenna structure can comprise antenna component 15 on the top side of upper substrate 12 and antenna component 15 on the bottom side of upper substrate 12. A fourth antenna structure can comprise lower antenna pattern 1125g and lower antenna pattern 1125. A fifth antenna structure can comprise lower antenna pattern 1125g and upper antenna pattern 1225. A sixth antenna structure can comprise upper antenna pattern 1225g and upper antenna pattern 1225. It should be noted that these are merely some examples of the possible combinations of antenna structures for electronic device 10, wherein various other combinations or permutations of antenna structures can provided, and the scope of the discloses subject matter is not limited in this respect.

Figure 2F:
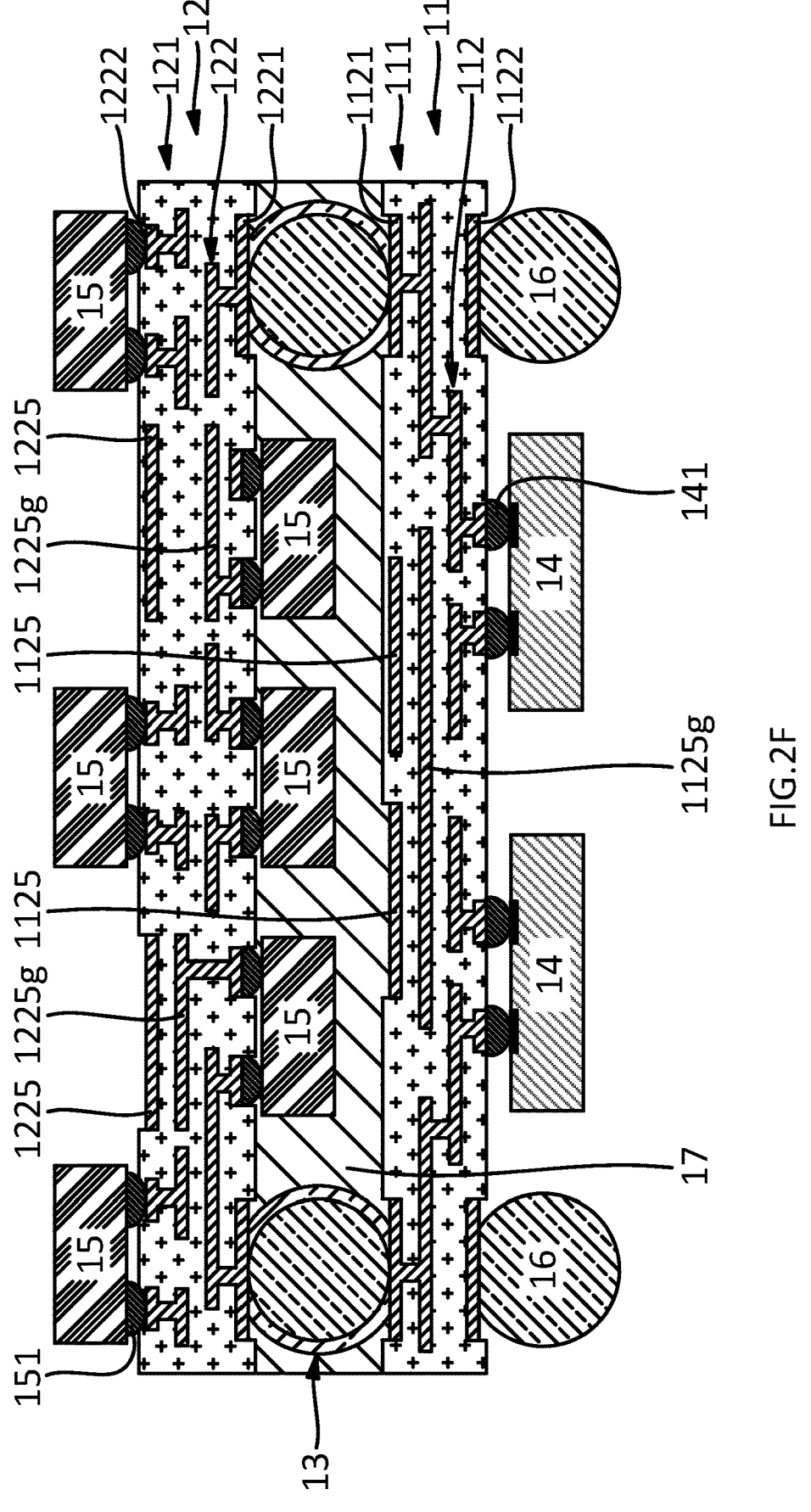

FIG. 2F shows a cross-sectional view of electronic device 10 at a later stage of manufacture. In the example shown in FIG. 2F, antenna components 15 can be provided on upper substrate 12. Antenna components 15 can be coupled to upper outer terminals 1222 of upper substrate 12 through component interconnects 151. Antenna components 15 provided on the top side of upper substrate 12 can be similar to antenna components 15 provided on the bottom side of upper substrate 12.

Figure 3:
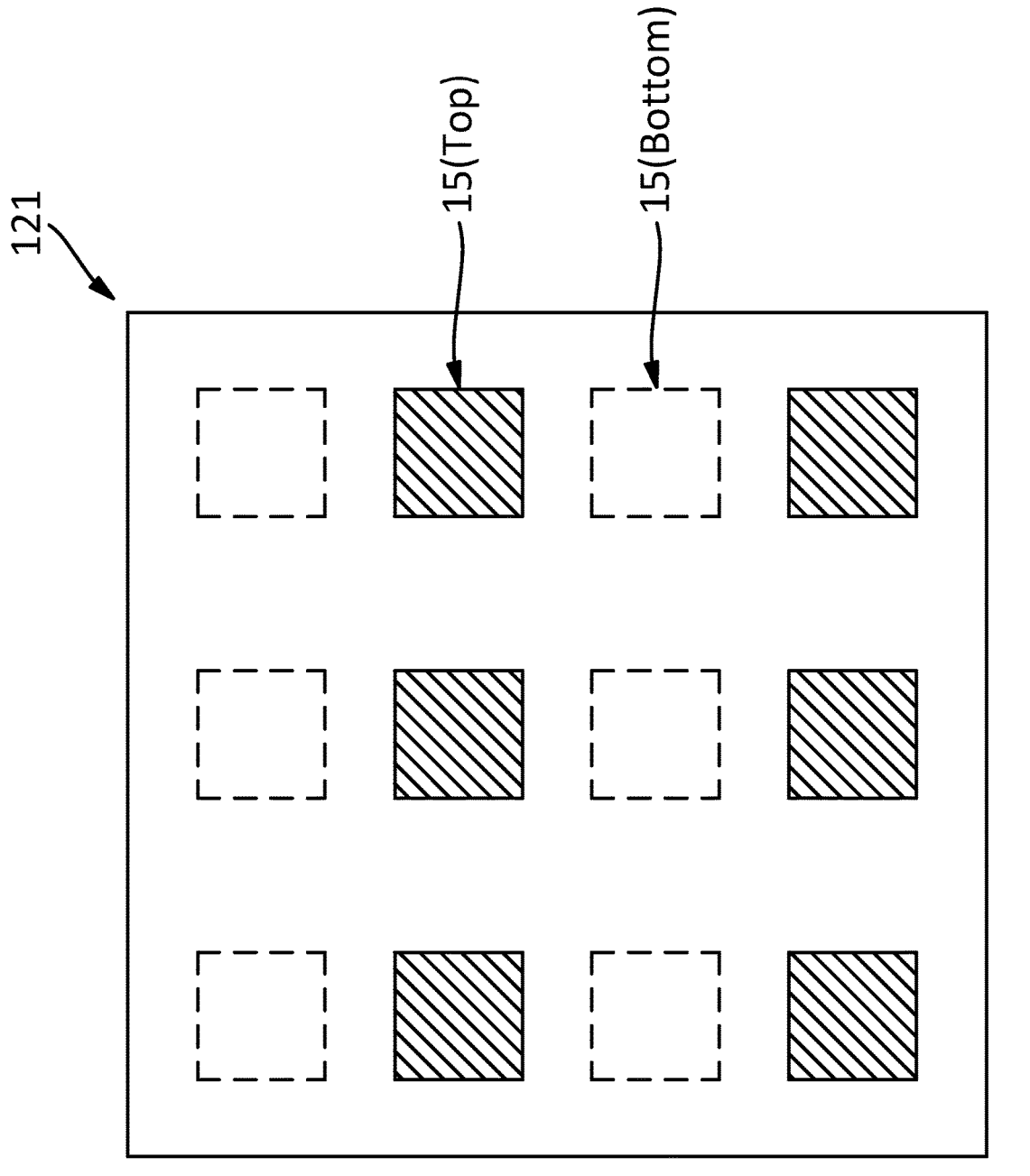
FIG. 3 shows a top view of an example electronic device.

FIG. 3 shows a top view of example electronic device 10. In the example shown in FIG. 3, one or more arrays of top side antenna components 15 are provided on the top side of upper substrate 12, for example on the top side of upper dielectric structure 121, and one or more arrays of bottom side antenna components 15 are provided on the bottom side of upper substrate 12. An array can comprise one or more rows. The top side antenna components 15 and the bottom side antenna components 15 are shown at different respective positions. As an example, one row of bottom side antenna components 15 can be provided between two rows of top side antenna components 15. As an example, one or more rows of top side antenna components 15 on the top side of substrate 12 can alternate, without overlapping, with one or more rows of bottom side antenna components 15 on the bottom side of substrate 12. In some examples, a first array of antenna components 15 is offset from a second array of antenna components 15 such that a first antenna component 15 does not overlap a second antenna component 15. In other examples, a first array of antenna components 15 comprises a first row of antenna components, and a second array of antenna components comprise a second row of antenna components wherein the first row of antenna components 15 is offset from the second row of antenna components 15 such that the first row of antenna components 15 does not overlap the second row of antenna components 15. The arrays of top side antenna components 15 and the arrays of bottom side antenna components 15 can increase the overall number of antenna components 15 in a thin profile structure.

Figure 4:
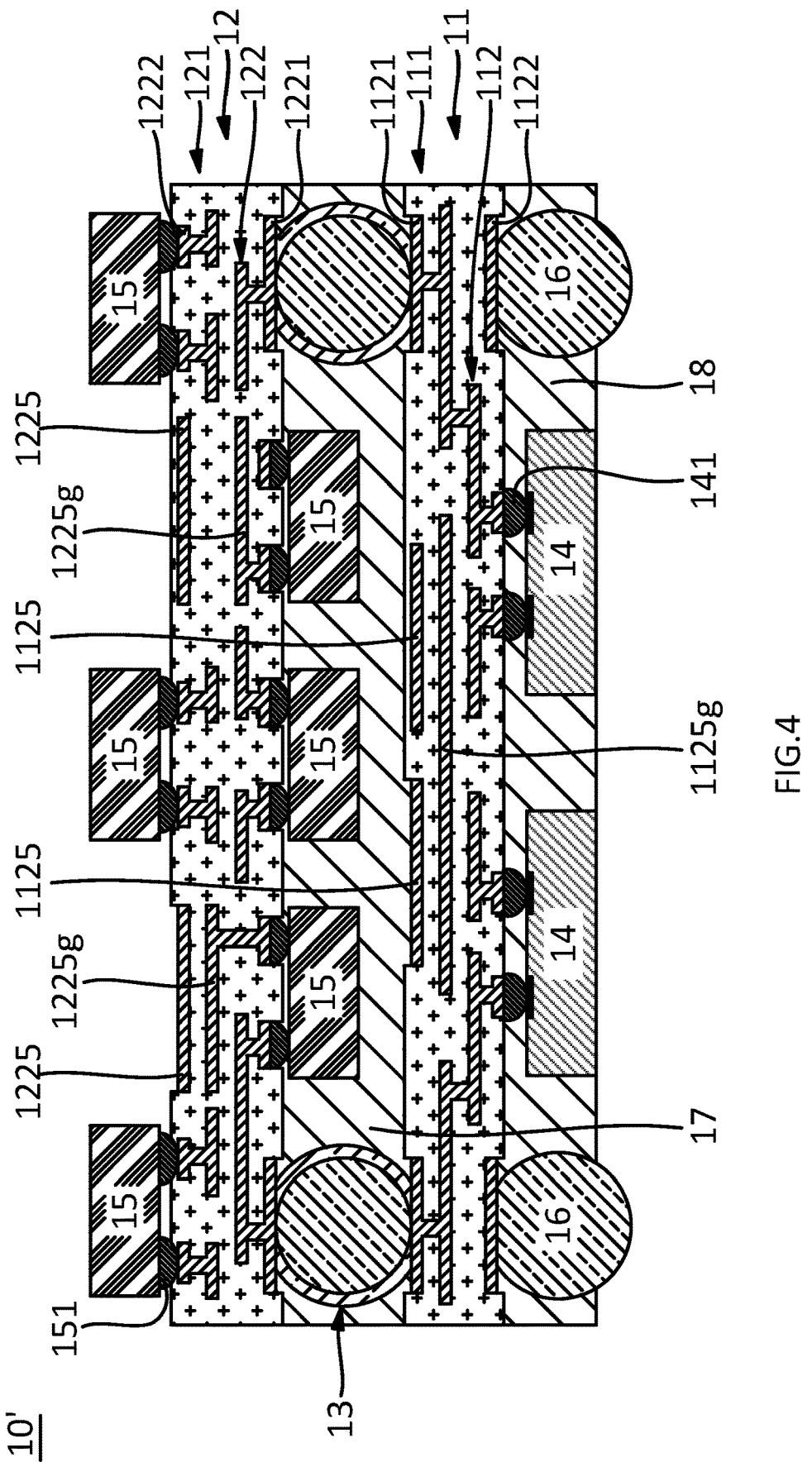
FIG. 4 shows a cross-sectional view of an example electronic device.

FIG. 4 shows a cross-sectional view of an example electronic device 10'. In the example shown in FIG. 4, electronic device 10' can be similar to electronic device 10 and can comprise external encapsulant 18. Electronic device 10' can be similar to electronic device 10, but at a later stage of manufacture. External encapsulant 18 can contact the bottom side of lower substrate 11. Upper substrate 12 can be over a top side of lower substrate 11, and upper conductive structure 122 of upper substrate 12 can comprise one or more upper antenna patterns 1225 of a patch antenna. In some examples, upper antenna patterns 1225 can be exposed at a top side of upper substrate 12, or upper antenna patterns 1225 can be covered by upper dielectric structure 121. In some examples, upper conductive structure 122 can comprise a ground plane antenna pattern 1225g for the patch antenna, or lower conductive structure 112 can comprise a ground plane antenna pattern 1225g for the patch antenna. Internal interconnects 13 can be between upper substrate 12 and lower substrate 11 and can be coupled with upper conductive structure 122 and lower conductive structure 112. Internal encapsulant 17 can be between upper substrate 12 and lower substrate 11 and can contact internal interconnects 13. Antenna components 14 can be coupled with upper conductive structure 122. Electronic component 14 can be below a bottom side of lower substrate 11 and can be coupled with lower conductive structure 112. External encapsulant 18 can contact electronic component 14 such as a lateral side of electronic component, or external interconnects 16. In some examples, the bottom side of electronic component 14 can be exposed through external encapsulant 18. In some examples, some regions of external interconnects 16 can be exposed through external encapsulant 18. The thickness of external encapsulant 18 can range from approximately 50 μm to approximately 800 μm. In some examples, external encapsulant 18 can protect electronic component 14 or external interconnects 16 from external elements or environmental exposure.

The present disclosure includes reference to certain examples. It will be understood, however, by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a lower substrate comprising a lower dielectric structure and a lower conductive structure;
an electronic component coupled with a bottom side of the lower substrate and coupled with the lower conductive structure;
an upper substrate over a top side of the lower substrate and comprising an upper dielectric structure and an upper conductive structure;
an internal interconnect between the upper substrate and the lower substrate and coupled with the upper conductive structure and the lower conductive structure;
a first antenna component between the upper substrate and the lower substrate and coupled with the upper conductive structure; and
an internal encapsulant material between the upper substrate and the lower substrate and contacting the internal interconnect and covering a lateral side of the first antenna component, wherein the first antenna component is inside the internal encapsulant material;

wherein the first antenna component comprises a plurality of component interconnects coupled to the upper conductive structure; and
wherein the plurality of component interconnects are at a first side of the first antenna component facing the upper substrate between the first side of the first antenna component and a bottom side of the upper substrate.

2. The electronic device of claim 1, comprising:
a second antenna component over a top side of the upper substrate and coupled with the upper conductive structure.

3. The electronic device of claim 2, wherein:
the first antenna component is part of a first array of antenna components on the bottom side of the upper substrate; and
the second antenna component is part of a second array of antenna components on the top side of the upper substrate.

4. The electronic device of claim 3, wherein:
the first array of antenna components is offset from the second array of antenna components such that the first antenna component does not overlap the second antenna component.

5. The electronic device of claim 3, wherein:
the first array of antenna components comprises a first row of antenna components;
the second array of antenna components comprise a second row of antenna components; and
the first row of antenna components is offset from the second row of antenna components such that the first row of antenna components does not overlap the second row of antenna components.

6. The electronic device of claim 1, wherein:
the lower conductive structure comprises an antenna pattern.

7. The electronic device of claim 1, wherein:
the internal interconnect comprises a solder-coated metal core ball.

8. The electronic device of claim 1, wherein:
the internal encapsulant material has a thickness from about 60 micrometers to about 1020 micrometers;
the first antenna component has a thickness from about 40 micrometers to about 1000 micrometers; and
the thickness of the internal encapsulant material is greater than the thickness of the first antenna component.

9. The electronic device of claim 1, wherein:
the upper substrate is a low complexity substrate comprising up to three upper conductive layers;
and the lower substrate is a medium complexity substate comprising up to six lower conductive layers; and
a number of lower conductive layers is greater than a number of upper conductive layers.

10. The electronic device of claim 1, comprising:
an external encapsulant below the bottom side of the lower substrate and contacting a lateral side of the electronic component, wherein a bottom side of the electronic component is exposed from the external encapsulant.

11. The electronic device of claim 1, comprising:
an external interconnect coupled with the lower conductive structure and having a thickness of about 50 micrometers to about 1000 micrometers;
wherein:
the electronic component has a thickness from about 50 micrometers to about 800 micrometer; and the thickness of the external interconnect is greater than the thickness of the electronic component.

12. The electronic device of claim 1, wherein the plurality of component interconnects comprise solder.

13. An electronic device, comprising:

a lower substrate comprising a lower dielectric structure and a lower conductive structure;

an electronic component below a bottom side of the lower substrate and coupled with the lower conductive structure; and an upper substrate over a top side of the lower substrate and comprising an upper dielectric structure and an upper conductive structure, wherein the upper conductive structure comprises an upper antenna pattern comprising a patch antenna;

an internal interconnect between the upper substrate and the lower substrate and coupled with the upper conductive structure and the lower conductive structure;

an internal encapsulant material between the upper substrate and the lower substrate and contacting the internal interconnect; and an antenna component coupled with the upper conductive structure, wherein the antenna component is inside the internal encapsulant material, wherein the antenna component is coupled with the patch antenna;

wherein the antenna component comprises a plurality of component interconnects coupled to the upper conductive structure; and wherein the plurality of component interconnects are at a first side of the first antenna component facing the upper substrate between the first side of the antenna component and a bottom side of the upper substrate.

14. The electronic device of claim 13, wherein:

the upper antenna pattern is exposed at a top side of the upper substrate.

15. The electronic device of claim 13, wherein:

the upper antenna pattern is covered by the upper dielectric structure.

16. The electronic device of claim 13, wherein:

the upper conductive structure comprises a ground plane for the patch antenna.

17. The electronic device of claim 13, wherein:

the lower conductive structure comprises a ground plane for the patch antenna.

18. The electronic device of claim 13, comprising:

an external encapsulant below the bottom side of the lower substrate and contacting a lateral side of the electronic component.

19. The electronic device of claim 13, wherein the plurality of component interconnects comprise solder.

20. A method to manufacture an electronic device, comprising:

providing an upper substrate comprising an upper dielectric structure and an upper conductive structure;

providing a first antenna component coupled with the upper conductive structure;

providing an internal interconnect below a bottom side of the upper substrate and coupled with the upper conductive structure;

providing a lower substrate comprising a lower dielectric structure and a lower conductive structure, wherein the internal interconnect is coupled with the lower conductive structure;

providing an internal encapsulant material between the upper substrate and the lower substrate and contacting the internal interconnect and a lateral side of the first antenna component; and providing an electronic component coupled with a bottom side of the lower substrate and coupled with the lower conductive structure;

wherein the first antenna component is inside the internal encapsulant material;

wherein the first antenna component comprises a plurality of component interconnects coupled to the upper conductive structure; and wherein the plurality of component interconnects are at a first side of the first antenna component facing the upper substrate between the first side of the first antenna component and a bottom side of the upper substrate.

21. The method of claim 20, comprising:

providing a second antenna component over a top side of the upper substrate and coupled with the upper conductive structure.

22. The method of claim 20, comprising:

providing an external encapsulant below the bottom side of the lower substrate and contacting a lateral side of the electronic component.

23. The method of claim 20, wherein the plurality of component interconnects comprise solder.

* * * * *